United States Patent
Hayashi

[11] Patent Number: 6,094,248
[45] Date of Patent: Jul. 25, 2000

[54] CIRCUIT ARRAY SUBSTRATE FOR A DISPLAY DEVICE AND A METHOD OF MAKING THE SAME

[75] Inventor: Hisaaki Hayashi, Hyogo-ken, Japan

[73] Assignee: Kabushiki Kaisha Toshiba, Kawasaki, Japan

[21] Appl. No.: 09/288,323

[22] Filed: Apr. 8, 1999

[30] Foreign Application Priority Data

Apr. 8, 1998 [JP] Japan .................................. 10-095842

[51] Int. Cl.⁷ .................................................. G02F 1/1343
[52] U.S. Cl. ............................................................ 349/139
[58] Field of Search .............................. 349/139, 42, 142, 349/140

[56] References Cited

U.S. PATENT DOCUMENTS 5,541,748  7/1996  Ono et al. .................................. 349/42
5,956,104  9/1999  Hayashi et al. ............................ 349/42

FOREIGN PATENT DOCUMENTS 10-253985  9/1998  Japan .

*Primary Examiner*—William L. Sikes
*Assistant Examiner*—Dung Nguyen
*Attorney, Agent, or Firm*—Pillsbury Madison & Sutro LLP

[57] ABSTRACT

A circuit array substrate for a display device includes a plurality of parallel signal and scanning lines disposed on an insulation substrate which cross each other at a right angle. The signal lines are made of at least upper and lower laminated layers. The upper layers made of aluminum or aluminum alloy are wider in width at the crossing portions with said scanning lines than the lower layers made of indium tin oxide. If the lower layers have cracks at the crossing portions during their patterning process, the wider upper layers cover the lower layers to keep etchant for the aluminum from soaking into the cracks. Thus, such a structure of the signal lines avoids causing the signal lines to break or malfunction.

8 Claims, 3 Drawing Sheets

CIRCUIT ARRAY SUBSTRATE FOR A DISPLAY DEVICE AND A METHOD OF MAKING THE SAME

BACKGROUND OF THE INVENTION

Field of the Invention

This invention relates to a circuit array substrate and a method of making the same and, more particularly, to a circuit array substrate for a display device configured to avoid causing multi-layered lines to break and/or malfunction and a method of making the same.

Display devices, such as liquid crystal display devices and plasma display devices, have been developed and put into practical use. Many display devices are provided with a circuit array substrate on which a plurality of signal and scanning lines are disposed in a matrix form.

An active-matrix type liquid crystal display device is described hereinafter by way of example of such display devices. The liquid crystal display device includes a pair of circuit array and counter substrates provided opposite to each other and a liquid crystal layer held, as a light modulation layer, in a gap between the array and counter substrates. The array substrate includes a glass substrate, signal and scanning lines disposed on the glass substrate in a matrix form, switching elements, e.g., thin film transistors (TFTs) located in the vicinities of crossing portions of the signal and scanning lines, pixel electrodes connected to the TFTs, and an alignment layer coated on an upper surface of the lines, the TFTs, and the pixel electrodes. The signal and scanning lines are made of a low electric resistance material such as aluminum (Al) and molybdenum-tungsten (MoW), respectively. The pixel electrodes are made of a transparent conductive material such as indium tin oxide (ITO). The pixel electrodes are, however, made of a metal material such as Al for a reflection type liquid crystal display device.

There are storage capacitors formed by the pixel electrodes, their adjacent scanning lines, and an isolation layer disposed between the pixel electrodes and the scanning lines. The counter substrate also includes an ITO electrode on the inner surface of which an alignment layer is coated.

It is well known that the signal line is made of upper and lower laminated layers in which the former is the same ITO layer as the pixel electrode and the latter is a low electric resistance layer such as an Al layer provided on the ITO layer. The signal line is redundant in structure to maintain its conductivity even when either the ITO or Al layer is broken. Thus, independent photo-lithographic processes are necessitated for forming the ITO and Al layers, respectively. As a result, if the alignment of the ITO deviates from the Al layer between their independent processes, the storage capacitor defined between the signal line and the pixel electrode changes due to distance differences between them. As a solution of such change in storage capacitor, it may be considered that the ITO layer is made wider in width than the ITO layer to keep the distance substantially constant, no matter whether relative alignment deviations exist between the layers.

The inventor's experiment has revealed that the production yield still decreases resulting from breaking or malfunction of the signal lines even with such a structure set forth immediately above. According to further research made by the inventor, it has been found that such breaking or malfunction often takes place at the portions where the signal and scanning lines cross each other.

SUMMARY OF THE INVENTION

An object of the present invention is to provide a circuit array substrate for a display device with a countermeasure to prevent signal lines from breaking or malfunction and a method of making the same.

An object of the invention is to provide a circuit array substrate for a display device in which a signal line structure avoids causing signal lines to break or malfunction at the crossing portions with scanning lines and a method of making the same.

A further object of the invention is to provide a circuit array substrate for a display device at a high production yield and a method of making the same.

According to one aspect of the present invention, a circuit array substrate for a display device of the present invention includes a substrate, first and second lines provided on the substrate which cross each other, and an isolation layer disposed between the first and second lines. The second line further includes at least a lower layer and an upper layer disposed on the lower layer. The upper layer is wider in width at the crossing portion with the first line than the lower layer, and the upper layer is narrower in width at the non-crossing portion with the first line than the lower layer.

According to one aspect of the present invention, a circuit array substrate for a display device includes a substrate, a plurality of substantially parallel scanning lines provided on the substrate, a plurality of signal lines crossing the scanning lines substantially at a right angle, an isolation layer disposed between the scanning lines and the signal lines at the crossing portions between the scanning lines and the signal lines, a plurality of switching elements connecting between the scanning and signal lines, a plurality of pixel electrodes connecting the switching elements, and each of the signal lines including a lower layer and an upper layer disposed on the lower layer.

The lower layer is made of the same material as the pixel electrode, the upper layer is wider in width at the crossing portion with the scanning line than the lower layer, and the upper layer is narrower in width at the non-crossing portion with the scanning line than the lower layer.

The substrate is made of a light transmission material while the pixel electrode of a light transmission and electric conductive material.

The pixel and lower layer are made by applying a patterning process through an identical mask.

The upper layer is designed to cover the lower layer on a basis of alignment accuracy of the upper and lower layers.

According to one aspect of the invention, a method of making a circuit array substrate for a display device comprises the steps of forming a first line on a substrate, disposing an isolation layer on the first line, and forming a second line on the isolation layer to cross the first line. The second layer forming step includes depositing and patterning a first electric conductive material to form a lower layer, and depositing and patterning a electric conductive material to form an upper layer which is narrower in width at a non-crossing portion with the first line than the lower layer, and which is wider in width at a crossing portion with the first line than the lower layer.

According to one aspect of the invention, a method of making a circuit array substrate for a display device comprises the steps of preparing a substrate, disposing a plurality of substantially parallel scanning lines on the substrate, forming an isolation film on the scanning lines, depositing and patterning a first electric conductive material to make a plurality of substantially parallel lower layers crossing the scanning lines at an approximately right angle and a plurality of pixel electrodes in regions defined by the scanning lines and the lower layers, and depositing and patterning a second electric conductive material to make a plurality of substantially parallel upper layers.

The lower and upper layers are used for signal lines, the lower layers are wider in width at non-crossing portions with the scanning lines than the upper layers, and the lower layers are narrower in width at the crossing portions with the scanning lines than the upper layers.

The patterning steps of the first and second electric conductive materials have maximum tolerable alignment deviations of W1 and W2, respectively, and the upper layers are wider by $\{(W1+W2)\times 2\}$ at the crossing portions with the scanning lines than the lower layers.

The above-stated and other objects and advantages of the invention will become apparent from the following description when taken with the accompanying drawings. It will be understood, however, that the drawings are for purposes of illustration and not to be construed as defining the scope or limits of the invention, reference being had for the latter purpose to the claims appended hereto.

DETAILED EXPLANATION OF THE PREFERRED EMBODIMENT

Figure 1:
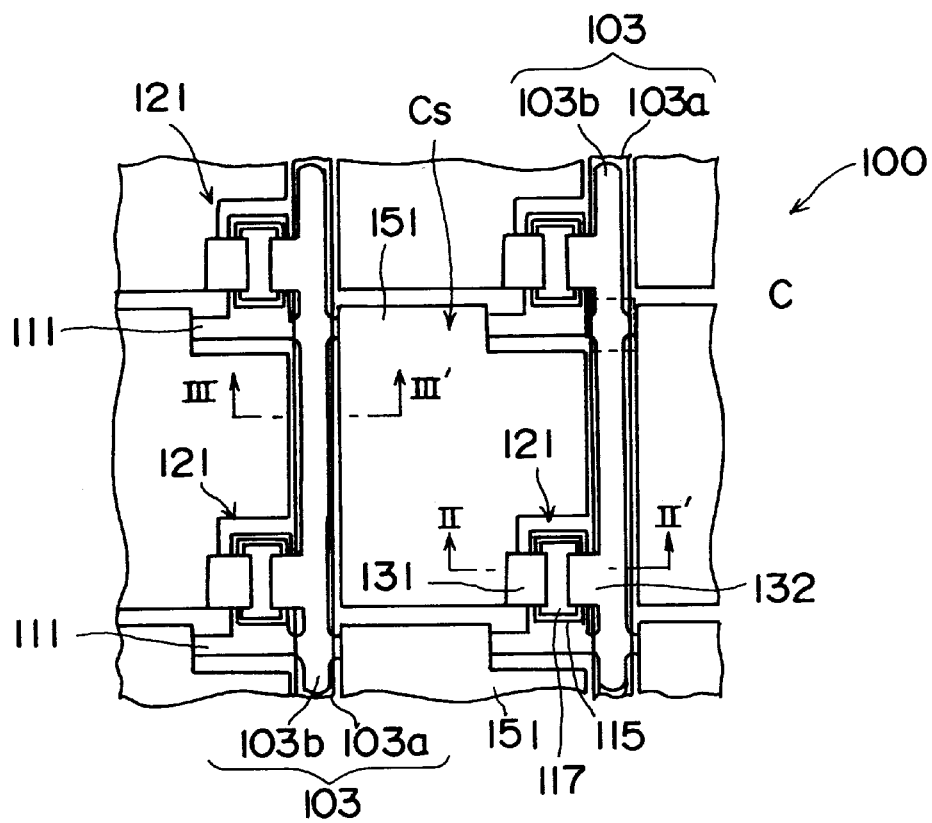
FIG. 1 shows a schematic plan view of a circuit array substrate in a liquid crystal display device according to the present invention.
Figure 2:
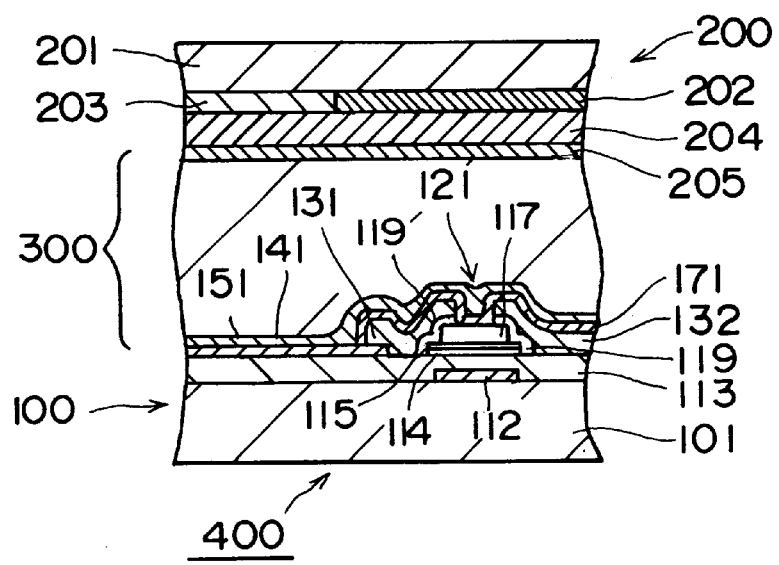
FIG. 2 is a schematic sectional view of the liquid crystal display device assembled with the array substrate which is taken along the line II–II' of the liquid crystal display device shown in FIG. 1.

An embodiment of the present invention will be explained with reference to the drawings. FIG. 1 schematically shows the layout of a circuit array substrate 100. Such a circuit array substrate 100 is assembled with a counter substrate 200 and a liquid crystal layer 300 as a light modulation layer to make an active-matrix type liquid crystal display device 400 as shown in FIG. 2.

This display device 400 is designed to function as a light transmission type normally white mode, for instance. FIG. 2 is a sectional view of the assembled display device 400 taken along the line II–II' of the array substrate 100. The liquid crystal layer 300 is made of a twisted nematic liquid crystal material. Other materials, such as a ferroelectric liquid crystal material, an antiferroelectric liquid crystal material and a polymerdispersion type liquid crystal material may be used for the light modulation layer.

The counter substrate 200 includes a transparent isolation substrate 201 made of a sheet of glass, and three layers laminated on the glass substrate 201 provided with a light blocking layer 202 and a color filter 203, a counter electrode 204, and an alignment layer 205. The light blocking layer 202 covers portions corresponding to a TFT 121, a gap between a pixel electrode 151 and a signal line 103, and a gap between the pixel electrode 151 and a scanning line 111 (see FIG. 1). The light blocking layer 202 is made of a metal film, e.g., a chromium film, or a black organic resin film.

The color filter 203 is disposed opposite to a portion corresponding to the pixel electrode 151. The color filter 203 consists of red (R), green (G) and blue (B) elements. The counter electrode 204 and the pixel electrode 151 are provided to supply a voltage to the liquid crystal layer 300. The alignment layer 205 is configured to align liquid crystal molecules in a predetermined direction.

Polarizers (not shown) are provided on the outer and bottom surfaces of the liquid crystal display device 100, i.e., those of the glass substrates 101 and 201, respectively. The polarizers cross each other at a right angle.

As shown in FIG. 1, a plurality of the signal and scanning lines 103 are also disposed to cross each other at a right angle in the array substrate 100 of this embodiment. The scanning line 111 is disposed directly on the glass substrate 101 or indirectly thereon through an insulation layer which confines impurities, if any, on the glass substrate. The scanning line 111 is made of a low electric resistance material, e.g., Al, Al alloy, or MoW. The signal line 103 is disposed on an insulation layer 113 and is formed by an ITO (lower) layer 103a and an Al (upper) layer 103b.

The TFTs 121 and the pixel electrodes 151 connected thereto are disposed in the vicinities of crossing portions of the signal and scanning lines 103 and 111. The pixel electrode 151 is made of a light transmission and electric conductive material, e.g., ITO. As shown in FIG. 2, the TFT 121 is of a well known structure provided with a gate electrode 112, a first gate isolation film 113 made of silicon oxide ($SiO_2$), a second gate isolation film 114 made of silicon nitride (SiNx), a semiconductor film 115, a channel protection film 117 made of SiNx, a low electric resistance film 119, a source electrode 131, a drain electrode 132, and a protection film 171.

The semiconductor film 115 is made of hydrogen amorphous silicon a-Si:H. Underneath the semiconductor film 115, the gate electrode 112 is provided protruding from the scanning line 111. The laminated first and second gate isolation films 113 and 114 are disposed between the semiconductor film 115 and the gate electrode 112. The SiNx channel protection film 117 is formed on the semiconductor film 115. The low electric resistance film 119 made of n+ type a-Si is connected to the semiconductor film 115 at its side ends, respectively. The low electric resistance film 119 is also connected to the source and drain electrodes 131 and 132, respectively. The source and drain electrodes 131 and 132 are further connected to the pixel electrode 151 and the signal line 103, respectively.

In order to display color images, the red (R), green (G) and blue (B) color elements are disposed side by side on the pixels in the lateral direction. The number of the pixels on the display are (1024'3) in the horizontal direction and 768 in the vertical direction. Thus, the number of the signal and scanning lines 103 and 111 are (1024'3) and 768, respectively.

The channel region of the semiconductor film 115 and the TFT 121 are covered by the channel protection film 117 and the SiNx isolation film 171, respectively.

A part of the pixel electrode 151 is overlapped with its neighboring scanning line 111 through the isolation film 113 to form the storage capacitor Cs. The neighboring scanning line 111 in this case is driven immediately prior to the one connected to the pixel electrode 151 in question.

Figure 3:
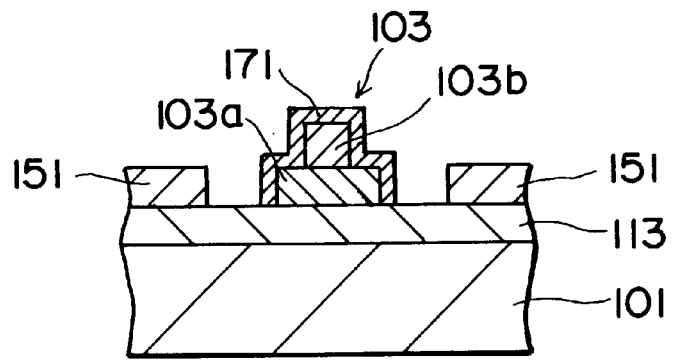
FIG. 3 is a schematic sectional view taken along the line III–III' of the liquid crystal display device shown in FIG. 1.
Figure 4:
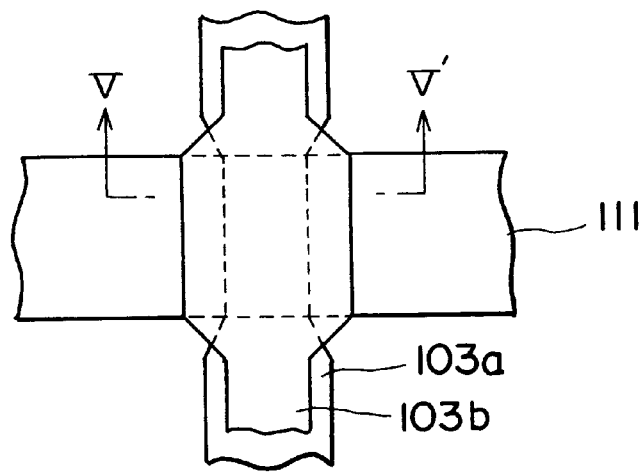
FIG. 4 is an enlarged plan view of the signal and scanning line portion C of the circuit array substrate shown in FIG. 1.
Figure 5:
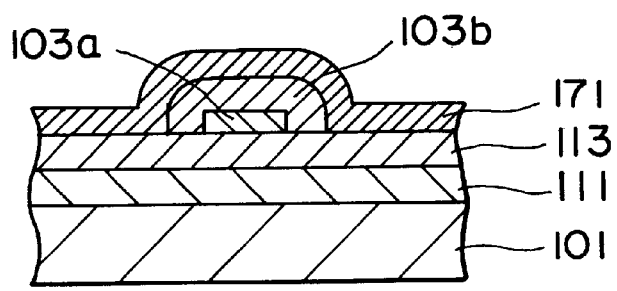
FIG. 5 is a sectional view taken along the line V–V' of the portion shown in FIG. 4.

Now, the structure of the signal line 103 will be described in greater detail with reference to FIGS. 3 through 5. FIG. 3 is a schematic sectional view of the signal line 103 taken along the line III–III' of the array substrate shown in FIG. 1. Figure 4 is the enlarged plan view of the portion C (crossing portion of the signal and scanning lines 103 and 111) of the array substrate shown in FIG. 1. FIG. 5 is a sectional view taken along the line V–V' of the signal line shown in FIG. 4.

The structure of the signal line 103 is a multi-layer lamination disposed on the isolation layer 113. In this embodiment, the signal line 103 is a lamination of lower and upper layers 103a and 103b and a protection layer 171. The lower and upper layers 103a and 103b are independently subject to light exposed patterning processes through different masks, respectively. The lower layer 103a is made of the same material (ITO) as the pixel electrode 151. The upper layer 103b disposed on the lower layer 103a is made of Al. The protection layer 171 is made of the same one as the surface protection film for the TFT 121. Since the signal line 103 has such a redundant lamination structure, the signal line 103 maintains electric conduction as a whole even when either one of the layers 103a and 103b breaks.

As shown in FIGS. 1 and 3, the lower layer 103a is wider in width than the upper layer 103b in the embodiment where the signal line 103 does not cross the scanning line 111. Thus, even if the lower layer 103a is not completely in alignment with the upper layer 103b, the distance between the signal line 103 and the pixel electrode 151 is substantially constant so that the storage capacitor defined thereby is not substantially subject to change.

Further, as shown in FIGS. 1 and 4, the first layer 103 is narrower in width than the upper layer 103b and the latter 103b completely cover the former 103a in the present embodiment where the signal line 103 crosses the scanning line 111. Thus, this structure can effectively avoid causing the signal line 103 to break or malfunction. The reason will be explained hereinafter in detail in light of the manufacturing process of the array substrate 100.

First, the scanning line 111 is formed on the surface of the glass substrate 101. Al, Al alloy, or MoW is deposited on the surface of the glass substrate 101 by applying a sputtering process. The stripe-like patterning is performed for the deposited metal to form the gate electrodes 112 and the scanning lines 111.

Secondly, the gate isolation film 113 is formed. An isolation material, such as $SiO_2$ or SiNx, is deposited in the thickness of 300 nm, for example, on the gate electrode 112 and the scanning line 111 to make the isolation film.

Finally, the essential components of the TFTs 121 are made. An a-Si:H film is deposited in the thickness of about 50 nm, for instance, on the gate isolation film 113. An SiNx film is then deposited in the thickness of about 300 nm on the a-Si:H film. The patterning of the deposited a-Si: H and SiNx films is carried out to form the semiconductor film 115 and the channel protection film 117. The n+ type a-Si: H film is then deposited on the semiconductor film 115 and the protection film 117. The patterning of the deposited n+ type a-Si:H is performed to form the low electric resistance film 119. The ITO film is deposited in the thickness of about 40 nm. The patterning of the deposited ITO film is also carried out to form the pixel electrode 151 and the lower layer 103a of the signal line 103. The Al or Al alloy is deposited on the low electric resistance film 119 and the pixel electrode 151. The patterning of the deposited Al or Al alloy is performed to make the source and drain electrodes 131 and 132 and the upper layer 103b of the signal line 103. The source electrode 131 is connected between the TFT 121 and the pixel electrode 151 while the drain electrode 132 between the TFT 121 and the signal line 103 (the upper layer 103b). Further, after forming the protection film 171 to cover the TFT 121, the alignment film 141 is formed. Thus, the array substrate 100 of the liquid crystal display device 400 is completed.

The patterning of the signal line 103 in the manufacturing process set forth above is performed in the following way. As described above, the ITO film is deposited on the entire surface of the gate insulation film 113 on the glass substrate 101. A photoresist film is coated on the surface of the ITO film. A light exposure is applied to the photoresist film through a patterned photomask. The exposed photoresist film is developed and its unnecessary parts are selectively eliminated, i.e., the mask pattern is transferred to the photoresist film. The ITO film underneath the photoresist film is eliminated by applying the wet or dry etching through the remaining photoresist film as a mask. The ITO film is patterned with the photomask. The patterning process is completed after removing the photoresist film functioning as the mask from the ITO film. The upper layer 103b is formed by applying substantially the same process as set forth above for the lower layer 103a.

The signal line 103, however, is apt to break at the crossing portion with the scanning line 111. The inventor has investigated and, eventually, found the cause of such breaking phenomena.

Figure 6:
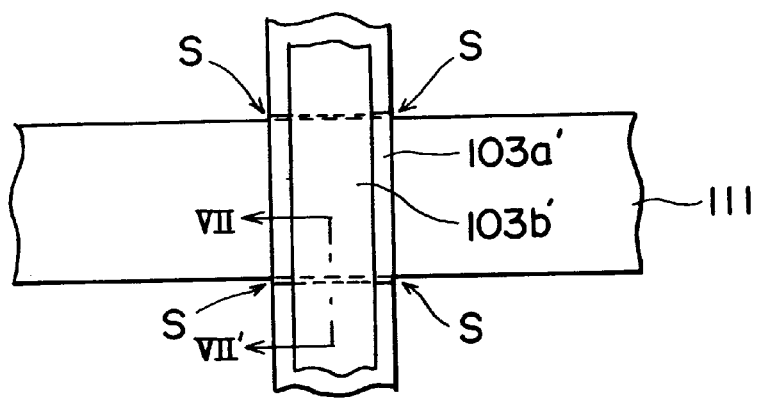
FIG. 6 is a plan view of a crossing portion of signal and scanning lines in a conventional circuit array substrate.

FIG. 6 is a schematic plan view of the crossing portion of signal and scanning lines in a conventional liquid crystal display device. As shown, a lower layer 103a' of the signal line 103 is wider in width than an upper layer 103b' even at the crossing portion. Because of this particular structure, the signal line 103 is often broken at the crossing portion.

Figure 7:
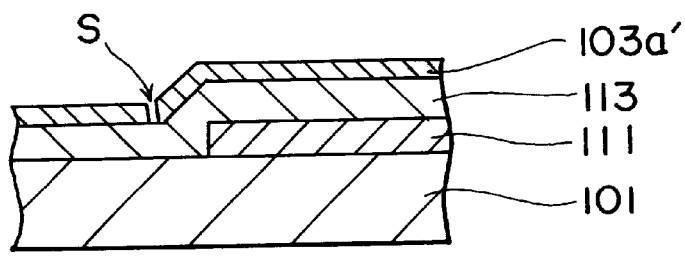
FIG. 7 is a part of a sectional view taken along the line VII–VII' of the cross portion shown in FIG. 6 to explain a line breaking process of the signal line.
Figure 8:
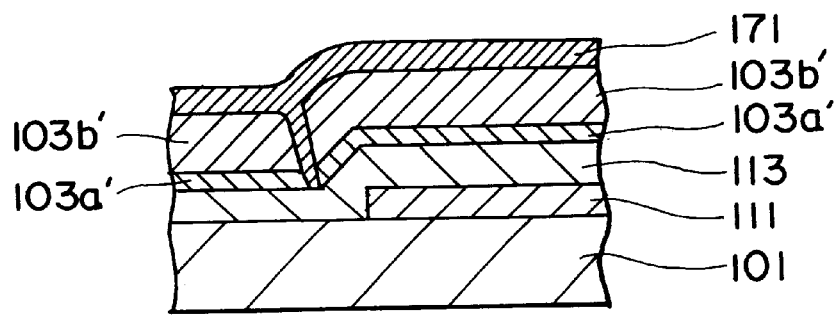
FIG. 8 is a sectional view taken along the line VII–VII' of the crossing portion shown in FIG. 6 to further explain a breaking mechanism of the signal line.

In order to explain such a breaking mechanism, FIGS. 7 and 8 show schematic sectional views taken along VII–VII' of the crossing portion shown in FIG. 6.

As shown in FIG. 7, since the thickness of the lower layer (ITO film) 103a' of the signal line 103 is relatively thin, a stepping-down portion of the lower layer 103a' is easily broken to define a crack "S". The upper layer 103b' is narrower in width than the first layer as described above so that the crack "S" is exposed. When the Al or Al alloy deposited on the lower layer 103a' is patterned by applying the wet-etching method, the etchant for the Al or Al alloy soaks into the crack "S". The soaking etchant gradually erodes away the patterned Al or Al alloy from the back side thereof. As a result, the upper layer 103b' is broken at the stepping-down portion as shown in FIG. 8.

The embodiment of the present invention, however, is structured in that the upper layer 103b is wider in width at the stepping-down portion than the lower layer 103a as shown in FIG. 4. As a result, even if the crack is caused in the lower layer 103a, its upper surface and side edges are completely covered with the upper layer 103b. As a result, the etchant is kept from soaking into the crack, if any.

According to the present invention, because the lower layer 103a is narrower in width at the crossing portion with the scanning line 111 than the upper layer 103b, i.e., the edge portions of the former does not extend from those of the latter at the crossing portion, the etchant does not soak into the crack of the lower layer 103a, if any, during the patterning process. The signal line 103 is not caused to break or malfunction. Thus, the array substrate of the present invention is manufactured at a high production yield.

It is desirable to determine the width difference between the lower and upper layers 103a and 103b in view of the alignment accuracy of the processes applied thereto. Preferably, the width of the upper layer 103b is designed for the upper layer 103b to sufficiently cover the lower layer 103a even in the event that an alignment deviation occurs during the patterning processes of the lower and upper layers 103a and 103b. For instance, where the tolerable deviations of the lower and upper layers 103a and 103b are "W1" and "W2" from their alignment standards during their patterning processes, respectively, the resultant relative deviation thereof is possibly "W1+W2" at maximum from the designed value. It is, therefore, desirable to design so that the width of the upper layer 103b is wider than {(W1+W2)×2} times that of the lower layer 103a.

Further, the width of the lower layer 103a, however, is preferably wider at the non-crossing portion with the scanning line 111 than that of the upper layer 103b. Where the alignment accuracy of the lower and upper layers 103a and 103b is "W1" and "W2", respectively, and the width of the lower layer 103a is designed to be wider than {(W1+W2)×2} times that of the upper layer 103b, the storage capacitor is substantially constant even if an alignment deviation takes place.

As different embodiments of this invention may be made without departing from the spirit and scope thereof, it is to be understood that the invention is not limited to its specific embodiments described herein.

As shown in FIG. 4, the present invention is essentially directed to the structure in which, at least, the upper layer 103b is wider at the crossing portion with the scanning line 111 than the lower layer 103a. Thus, the lower layer 103a, for instance, may be constant in width while the upper layer 103b may be wider in width at the crossing portion with the scanning line 111 than the lower 103a. Alternatively, the latter 103b may be constant in width while the former 103a may be narrower at the crossing portion with the scanning line 111 than the latter 103b.

Desirably, the crossing portion is made as small as possible to reduce a coupling capacitor between the signal and scanning lines 103 and 111.

The signal line 103 may be made of other materials than the ITO and Al (or Al alloy), respectively, and consist of three or more laminated layers in order to achieve substantially the same effect as the embodiments set forth above. In order for the upper layer, however, to cover the lower layer with possible cracks, the former must be wider in width than the latter in the case of the three or more laminated layers.

Although the embodiments are explained by way of example as to the crossing portion between the signal and scanning lines 103 and 111, the present invention is also applicable to other wiring devices in which at least two lines are crossed with each other through an insulation layer and either one of the lines is made of upper wider and lower narrower layers to prevent the lower layer from breaking.

The pixel electrode and a part of the signal line may be made of other materials including indium, zinc, and oxide, for instance. The display device may be a reflection-type liquid crystal display device provided with the pixel electrode and the like made of opaque materials. The liquid crystal display devices may also be driven by applying lateral electric fields, i.e., in-plain switching mode. Further, this invention is applicable not only to the array substrate of a liquid crystal display device but also to other circuit array substrates for display devices.

As described above, the present invention is to provide a multi-layer line which is redundant in structure to maintain electric conductivity even if one of the layers is broken.

According to the invention, since a signal line of a display device includes a narrower layer and a wider layer made of the same material as a pixel electrode at a non-crossing portion with a scanning line, a distance between the signal line and the pixel electrode is substantially constant regardless of an alignment deviation between the them so that change in storage capacitor between the signal line and the pixel electrode is substantially cancelled.

Further, according to the invention, since the signal line includes upper wider and lower narrower layers at a crossing portion with the scanning line and, more particularly, at a stepping-down portion of the lower layer, the signal line is quite effectively kept from breaking even if cracks are caused at the stepping-down portion. In other words, the upper wider portion completely covers the lower narrower layer in which those cracks are possibly caused at the stepping-down portion. As a result, the signal line is prevented from breaking due to soaking etchant into the cracks during the patterning process of the upper layer. Thus, the invention can significantly improve the production yield as well as the manufacturing cost of various display devices with high resolution displays capable of sophisticatedly defined patterns.

The invention provides great industrial advantages in that high resolution display devices can be manufactured at a high production yield.

What I claim is:

1. A circuit array substrate for a display device, comprising:

a substrate;

first and second lines provided on said substrate which cross each other; and an isolation layer disposed between said first and second lines;

wherein said second line includes at least lower and upper layers, said upper layer is wider in width at the crossing portion with said first line than said lower layer, and said upper layer is narrower in width at non-crossing portion with said first line than said lower layer.

2. A circuit array substrate for a display device, comprising:

a substrate;

a plurality of substantially parallel scanning lines provided on said substrate;

a plurality of signal lines crossing said scanning lines substantially at a right angle;

an isolation layer disposed between said scanning and signal lines;

a plurality of switching elements connecting between said scanning and signal lines;

a plurality of pixel electrodes connecting said switching elements; and each of said signal lines including lower and an upper layers;

wherein said lower layer is made of the same material as said pixel electrodes, said upper layer is wider in width at the crossing portion with said scanning line than said lower layer, and said upper layer is narrower in width at the non-crossing portion with said scanning line than said lower layer.

3. The circuit array substrate according to claim 2, wherein said substrate is made of a light transmission material, said pixel electrodes are made of a light transmission and electric conductive material.

4. The circuit array substrate according to claim 2 or 3, wherein said pixel electrode and lower layer are made by applying a patterning process through an identical mask.

5. The circuit array substrate according to claim 2, 3 or 4, wherein said upper layer is designed to cover said lower layer substantially regardless of alignment accuracy of said upper and lower layers.

6. A method of making a circuit array substrate for a display device, comprising the following steps of:

forming a first line on a substrate;

disposing an isolation layer on said first line; and forming a second line on said isolation layer to cross said first line;

wherein said second layer forming step includes steps of depositing and patterning a first electric conductive material to form a lower layer, and steps of depositing and patterning an electric conductive material to form an upper layer which is narrower in width at a non-crossing portion with said first line than said lower layer, and which is wider in width at a crossing portion with said first line than said lower layer.

7. A method of making a circuit array substrate for a display device, comprising the following steps of:

preparing a substrate;

disposing a plurality of substantially parallel scanning lines on said substrate;

forming an isolation film on said scanning lines;

depositing and patterning a first electric conductive material to make a plurality of substantially parallel lower layers which cross said scanning lines at an approximately right angle and a plurality of pixel electrodes in regions defined by said scanning and lower layers; and depositing and patterning a second electric conductive material to make a plurality of substantially parallel upper layers;

wherein said lower and upper layers are used for signal lines, said lower layers are wider in width at non-crossing portions with said scanning lines than said upper layers, and said lower layers are narrower in width at the crossing portions with said scanning lines than said upper layers.

8. The method of making a circuit array substrate for a display device according to claim 6 or 7, wherein said patterning steps of said first and second electric conductive materials have maximum tolerable alignment deviations of W1 and W2, respectively, and said upper layers are wider by $\{(W1+W2)\times 2\}$ at crossing portions with said scanning lines than said lower layers.

* * * * *